United States Patent [19]

Johnson

[11] Patent Number: 4,800,341
[45] Date of Patent: Jan. 24, 1989

[54] FAST SWITCHING FREQUENCY SYNTHESIZER

[75] Inventor: Edgar A. Johnson, Tujunga, Calif.
[73] Assignee: Eaton Corporation, Cleveland, Ohio
[21] Appl. No.: 115,027
[22] Filed: Nov. 2, 1987
[51] Int. Cl.$^4$ ............................................. H03L 7/16
[52] U.S. Cl. ...................................... 331/2; 331/25; 307/529
[58] Field of Search ............... 331/2, 25; 307/529; 455/91, 103, 113

[56] References Cited

U.S. PATENT DOCUMENTS 4,211,975 7/1980 Kuroda ............................ 331/18 X Primary Examiner—Eugene R. Laroche
Assistant Examiner—Robert J. Pascal
Attorney, Agent, or Firm—C. H. Grace

[57] ABSTRACT

A synthesizer produces step frequencies by multiplying the frequency of a reference oscillator and stimulating an SRD comb frequency generator, then adding or subtracting a reference frequency. The selected step frequency can be placed on either side of each picket of the comb's spectrum. A fine adjustment frequency is then added in a translation oscillator. The fine frequency component can also be placed on either side of the selected step frequency.

Frequency dividers, which would result in noisy final outputs, are not employed. Instead, the frequency of a reference signal is multiplied up in a narrowband channel to serve as a local oscillator, and the VCO signal frequency is reduced by heterodyning it down from its ultra-high frequency. The down-converted difference frequency is compared as to phase with the reference oscillator. The loop gain and bandwidth are so high in the phase lock loops that output noise is low and switching time is fast.

15 Claims, 2 Drawing Sheets

FAST SWITCHING FREQUENCY SYNTHESIZER

BACKGROUND OF THE INVENTION (1) Field of the Invention

The invention concerns frequency synthesizers for generating, e.g., ultra-high frequency signals, by combining frequencies from several sources.

(2) Description of the Prior Art

Many prior frequency synthesizers have been based upon phase lock loops. A reference input frequency $F_R$ is input as the first signal to a phase comparator, which receives a second input signal by means of feedback to be described below. The output of the phase comparator is a phase error signal which goes through a low pass filter and an amplifier and controls the frequency of a voltage-controlled oscillator (VCO). The output of the VCO is the desired synthesized frequency, which is N times $F_O$. A sample of that output frequency is input to a frequency divider which divides the frequency by N. After phase lock acquisition the output of the divider is at frequency $F_R$; it is the above-mentioned second input of the phase comparator.

This prior type of frequency synthesizer tends to have a noisy output because of noise that is introduced by the VCO and not effectively suppressed by the phase lock loop. The use of the frequency divider aggravates the output noise situation, as will be discussed below. The textbook "Electronic Devices and Circuit Theory", by R. Boylestad and L. Nashelsky, Prentice-Hall, Inc., describes on page 634 of the third edition an example of a synthesizer that utilizes a frequency divider.

SUMMARY OF THE INVENTION

According to the invention a frequency synthesizer has its output frequency formed by algebraic addition of a relatively high-frequency signal produced by a step oscillator subsystem and a relatively lower-frequency fine adjustment signal, the two signals being combined in a translation oscillator subsystem.

The step oscillator subsystem utilizes a relatively low frequency (e.g., 20 MHz), low-noise, high-stability reference signal generator, and multiplies its frequency to simulate a comb frequency generator. The output of the comb frequency generator, which in the example is in the UHF range, is mixed with the output of a voltage-controlled oscillator (VCO), which is pretuned approximately to a UHF frequency of either 20 MHz below a selectable frequency of the comb or 20 MHz above a selectable frequency of the comb. The 20 MHz offset is provided by the arrangement of a phase lock loop of the step oscillator subsystem.

Fine adjustment of final output frequency is accomplished by injecting a frequency in the range of 80 to 100 MHz into a phase lock loop that controls another VCO. This is the translation oscillator subsystem. The output of the second VCO is the final output of the synthesizer as a whole. The translation oscillator subsystem is arranged to add or subtract the 80 to 100 MHz fine tuning signal to a selectable one of the step frequencies provided by the step oscillator subsystem.

One object of the invention is to provide a frequency synthesizer having relatively low noise by avoiding the use of frequency dividers in the phase lock loop of the step oscillator subsystem, and instead heterodyning at an ultra-high frequency. This produces a difference frequency for phase comparison with a reference frequency source. A relatively low-noise reference multiplier concept is utilized instead of a noisy divider concept.

Another object is to provide a frequency synthesizer having a step oscillator subsystem with a phase lock loop that has very high loop gain and great loop bandwidth, so as to reduce output noise that originates in the voltage-controlled oscillator of the phase lock loop. The noise is reduced by responding quickly and forcefully to suppress it by feedback, the phase lock loop signal being tightly clamped thereby to a low-noise reference generator signal.

Another object is to provide a frequency generator in which a step oscillator subsystem utilizes a comb frequency generator to provide a plurality of reference frequencies, each of which can be used in the manner described immediately below to support two step frequencies.

Another object of the invention is to provide a frequency synthesizer that utilizes a step oscillator subsystem in which the coarse frequency steps are displaced in frequency selectively above and below each of a plurality of reference frequencies, whereby the number of step frequencies is about double the number of reference frequencies.

Another object is to provide a frequency synthesizer in which a fine adjustment frequency signal is combined with a step oscillator subsystem to produce a relatively continuous selection of frequencies at the output of the synthesizer, and in which the fine frequency signal is selectively added or subtracted so the result is either above or below the frequencies of the step oscillator subsystem.

Another object is to utilize the above-and-below step oscillator technique and the above-and-below fine adjustment technique of the foregoing objects in a plurality of subsystems of one frequency synthesizer to expand its performance capabilities.

BRIEF DESCRIPTION OF THE DRAWINGS

FIG. 5, entitled "Range Table", lists 32 ranges of output frequencies of the described embodiment, and the frequencies corresponding to each of those ranges at three points within the synthesizer.

FIG. 6, entitled "Examples", gives a few examples of output frequencies and corresponding frequencies at each of those same three points within the synthesizer.

DETAILED DESCRIPTION OF PREFERRED EMBODIMENT

Figure 1:
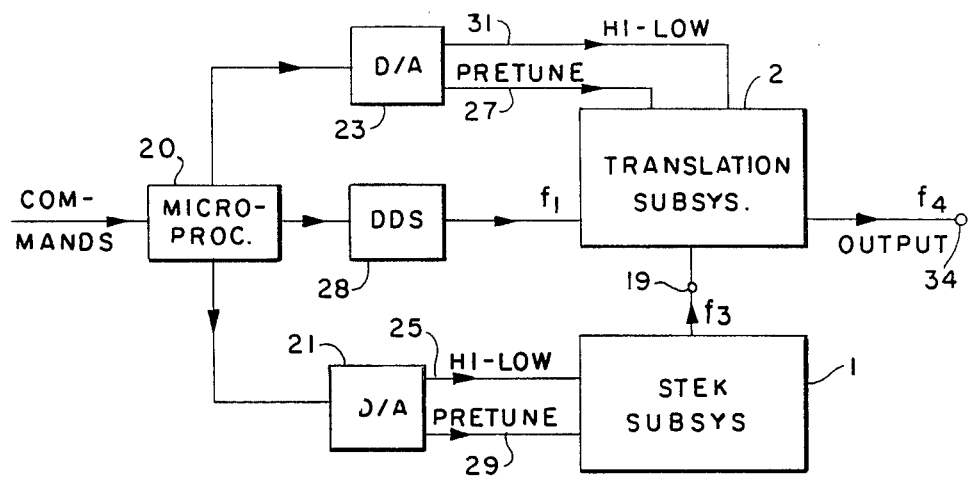
FIG 1 is a simplified electronic block diagram of a preferred embodiment of the invention.

As shown in FIG. 1, a subsystem 1 is a step frequency oscillator, whose output is connected to a translation oscillator subsystem 2, which includes a fine frequency adjustment circuit. A combination of the coarse and fine frequencies is output from the synthesizer at terminal 34.

The output frequency is selected by input commands to a microprocessor computer 20 (or by a program stored within it). Computer 20 provides various control signals to the step oscillator subsystem 1 and the translation oscillator subsystem 2 via two digital-to-analog (D/A) converters 21, 23, and a fine frequency synthesizer (FFS) 28. Those control signals will now be described.

The microprocessor 20 provides a digital command signal to D/A 21. The analog equivalent of a portion of that signal is connected on line 29 from D/A 21 to the step oscillator subsystem 1 to pretune a $VCO_1$ of that subsystem approximately to a selected range. The signal on the pretuning line 29 is a selected one of a plurality of predetermined DC voltage levels. Each DC voltage level corresponds to one step frequency of the lower half of the available step frequencies of the step oscillator subsystem 1, and to one step frequency in the upper half of the step frequencies of subsystem 1.

The microprocessor 20 also provides a high/low frequency range control signal 25 to subsystem 1. When the digital commands at the input of D/A 21 call for pretuning a frequency in the upper half of the frequency range of the step oscillator subsystem 1, the signal on the high/low signal line 25 is a positive current flowing to the step oscillator subsystem 1. When the commands call for pretuning a frequency in the lower half of the frequency range of subsystem 1, the signal on the high/low line 25 is a negative voltage.

In a similar manner the high/low control line 31 and control line 27 that connect from the microprocessor 20 to the translation oscillator subsystem 2 control respectively the selection of upper half or lower half of the complete frequency range, and of a particular frequency range within each such half of subsystem 2.

The FFS 28 receives command signals in the form of digital data from the microprocessor 20. At its output the FFS provides an essentially sinusoidal signal of frequency $f_1$, which is connected to the fine frequency input terminal of translation subsystem 2. Frequency $f_1$ contributes the fine frequency component of the final output signal of the entire apparatus; that final output frequency is denoted $f_4$.

Figure 2:
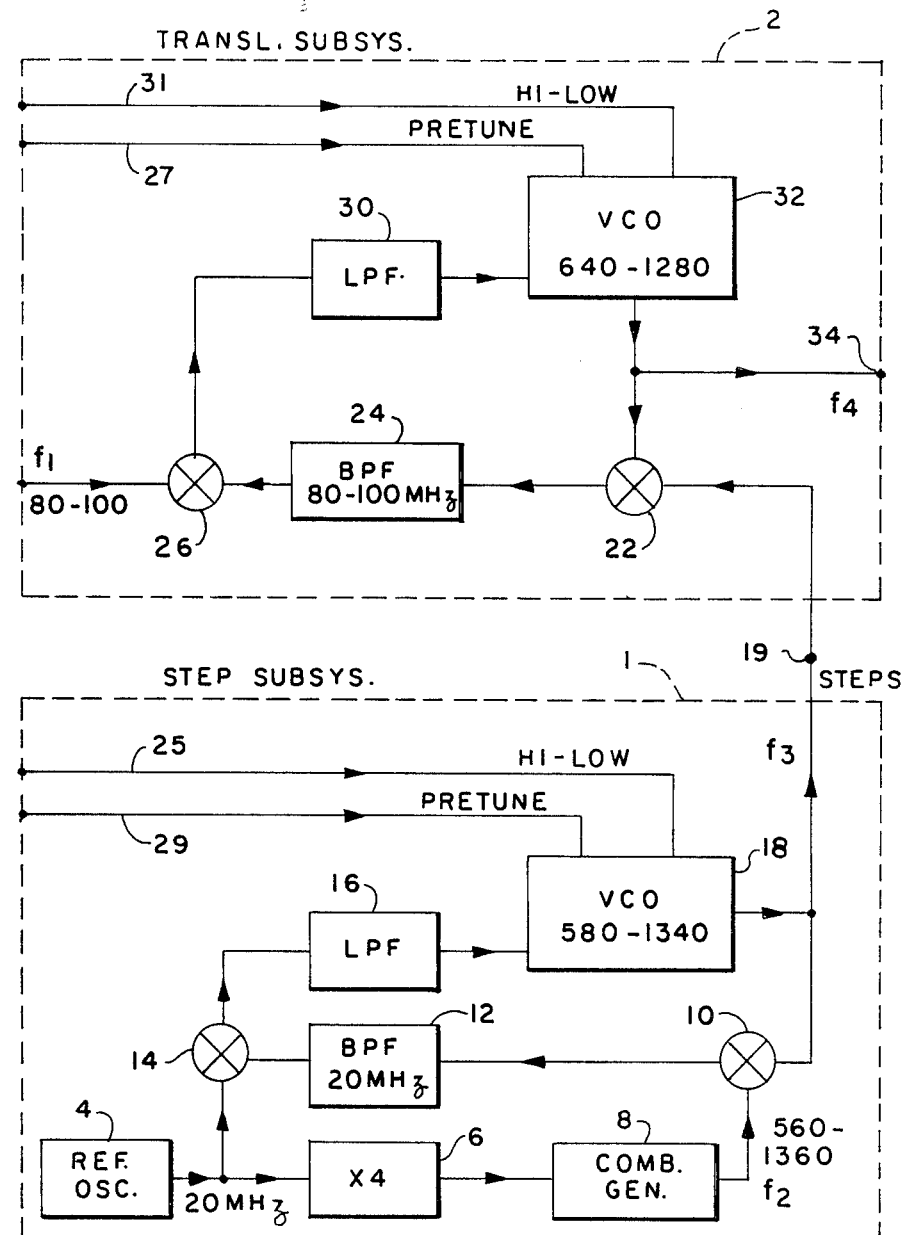
FIG. 2 is a more detailed block diagram of step oscillator subsystem 1 and translation oscillator subsystem 2 of FIG. 1.

Subsystems 1 and 2 are shown in more detail in FIG. 2. A 20 MHz reference oscillator 4 is provided for producing a fixed frequency, phase stable, low-noise sinusoidal signal. In the preferred embodiment it is a crystal oscillator, although a cesium type would also be suitable for some embodiments. Its output is connected to both a frequency multiplier 6 and a frequency/phase comparator 14.

The frequency multiplier 6 produces a sinusoidal output signal of 80 MHz. It is a balanced diode doubler followed in cascade by a 40 MHz crystal bandpass filter, then by another balanced diode doubler and an 80 MHz crystal bandpass filter. It is designed to have very low noise at its output.

Figure 3:
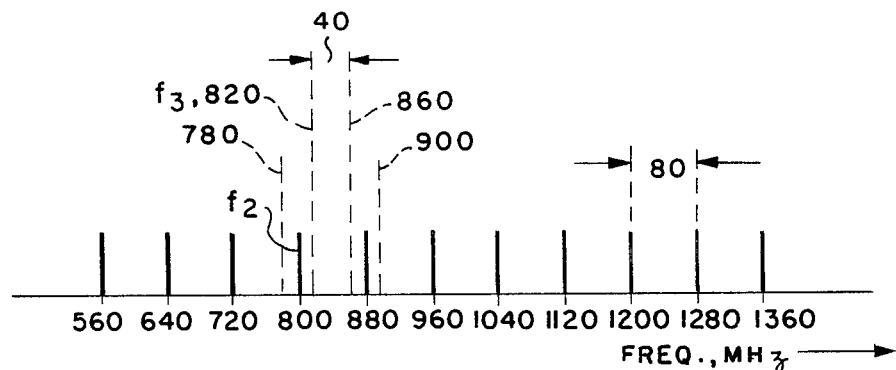
FIG. 3 is a stylized spectrum showing four typical step frequencies generated by step oscillator subsystem 1, in relation to two typical "comb" reference frequencies upon which they are based.

The output of multiplier 6 is connected to the input of a comb generator 8. The comb generator's purpose is to produce a plurality of discrete UHF output frequencies that are integral multiples of its input frequency of 80 MHz. The output signals of interest from comb generator 8 are 11 equally spaced frequencies from 560 to 1,360 MHz, as shown in FIG. 3. The comb generator is preferably a step recovery diode (SRD) of a type manufactured commercially by several companies, including Hewlett-Packard. It multiplies the 20 MHz reference frequency by factors ranging from 28 to 68, inclusive.

The comb generator output is connected to one input of a mixer 10, whose second input is the output of a voltage controlled oscillator ($VCO_1$) 18. $VCO_1$ 18 is the step frequency oscillator; the selected frequency of its output at any time is referred to here as $f_3$. In a steady state operating condition the frequency $f_3$ is 20 MHz above or below one of the Picket frequencies of the comb generator output. The particular picket frequency of the comb generator which is only 20 MHz different from $f_3$ is called $f_2$.

The mixer 10 heterodynes the two frequencies that it receives, and it outputs several frequencies, including their 20 MHz difference frequency, which is the one of interest. A bandpass filter 12 receives at its input the output signals of mixer 10. Filter 12 has a 20 MHz center frequency and a bandwidth which is selected to cooperate with another filter 16 to produce a loop bandwidth of about 4 MHz in a phase locked loop.

A frequency and phase comparator 14 receives input signals from both the 20 MHz reference oscillator 4 and the 20 MHz bandpass filter 12. The comparator is a balanced diode mixer type of phase detector. During a transient interval before the phase lock loop (10,12,14,16,18) achieves lockup, the output of comparator 12 is the frequency difference between those two input signals. After phase lock is achieved the output of comparator 14 is a bipolar DC signal that indicates the phase difference between its two 20 MHz input signals.

The output of comparator 14 is connected to the input of a lowpass loop filter 16. The purposes of the filter are to reject higher frequency components of the phase error signal that it receives at its input, to assist in controlling the loop bandwidth, and to assist in stabilizing the phase lock loop of which it is a part. The bandwidth of the phase lock loop is about 4 MHz.

The output of filter 16 is a phase error signal, which is relatively clean and fast-responsive. It is connected to the $VCO_1$ 18 to control its frequency.

The function of $VCO_1$ 18 is to produce a low-noise signal at a selected one ($f_3$) of a plurality of frequencies in 40 MHz steps from 580 MHz to 1,340 MHz. The $VCO_1$ 18 is switchable by means of the one-bit binary signal on control line 25 between a upper-frequency half of its total frequency span and a lower-frequency half, as described above. The high/low signal on line 25 is produced by the microprocessor 20 of FIG. 1 in response to the frequency selection dictated by external or internal commands.

When the signal on line 25 is a conventional current flowing into $VCO_1$ 18, a PIN diode in the $VCO_1$ is in a conductive condition, with a very low resistance that can be regarded as a short circuit. That PIN diode is connected across some turns of the $VCO_1$ oscillator's tank coil, so it changes the effective inductance of the coil and therefore the frequency range of the $VCO_1$, for any given control voltage on the $VCO_1$'s voltage-sensitive capacitor.

When the signal on line 25 is a negative DC voltage, the PIN diode is back-biased and is therefore effectively only a small capacitance in parallel with the coil turns across which it is connected. The $VCO_1$ then has a lower frequency range.

The control line from D/A 21 to the $VCO_1$ 18 is the retuning line 29. It conveys a preselectable one of a plurality of pretuning voltages for bringing the $VCO_1$'s output frequency within a desired frequency range. The voltage from line 29 and the output signal of the loop filter 16 are effectively added within the $VCO_1$ and applied to a control voltage input terminal of the oscillator to control its frequency of oscillation $f_3$.

The output of $VCO_1$ 18 is connected to one input of the mixer 10 to close the phase lock loop comprising components 10, 12, 14, 16 and 18. The loop locks coherently onto one of a number of step frequencies, each of which is 20 MHz above or below one of the comb picket frequencies ($f_2$) of the comb generator 8. The $VCO_1$ 18 therefore has output frequencies at 40 MHz intervals, even though it is locked to a comb generator whose available output frequencies are 80 MHz apart.

The output of $VCO_1$ 18 is connected also, via terminal 19, to one input of a low-noise mixer 22 in the translation oscillator subsystem 2, (FIG. 2). The function of mixer 22 is to heterodyne the output signals of two VCOs, namely the step oscillator 18 and the translation oscillator 32. The inputs to the mixer 22 are therefore (a) a step frequency $f_3$ in the range 580 to 1,340 MHz, received from $VCO_1$ 18 and (b) a frequency $f_4$ from $VCO_2$ 32, in the range of 640 to 1,280 MHz. The output signal component of mixer 22 that is of interest is the one whose frequency is the difference between the frequencies of $VCO_1$ 18 and $VCO_2$ 32; it is a variable frequency in the range 80 to 100 MHz.

A bandpass filter 24 receives the output from mixer 22. Its function is to separate the desired 80 to 100 MHz frequency and reject the others that it receives from mixer 22. Note that the range of frequency variation here is only 20 MHz, not 40 MHz. The output of bandpass filter 24 is connected to one input of a frequency and phase comparator 26, which is a balanced diode type of detector.

Comparator 26 receives an input also from the fine frequency synthesizer (FFS) 28, having frequency $f_1$. It is in the range 80 to 100 MHz also, its value controlling the fine adjustment of the output frequency $f_4$ of the entire synthesizer. Frequency $f_1$ is selected by the microprocessor 20. The output of comparator 26 is the difference frequency between its two inputs before lockup of the phase locked loop 22, 24, 26, 30, 32. After phase acquisition has occurred, the output of comparator 26 is a bipolar DC signal representative of the phase difference between the signals at its two inputs.

The output of phase detector 26 is connected to a loop filter 30. Several functions are performed by the bandpass filter 30. In cooperation with other elements of the loop, it establishes the loop bandwidth, which is 6 MHz in this embodiment. It also rejects undesired noise or spurious signals outside that bandwidth, so as to deliver a relatively clean but fast control signal voltage from its output to an input of the $VCO_2$ 32.

The $VCO_2$ 32 oscillates at the final desired output frequency of the entire system, which is between 640 MHz and 1,280 MHz. Its frequency $f_4$ is an algebraic sum of one of the step frequencies, $f_3$ of the step oscillator subsystem and a fine adjustment frequency $f_1$. The translation oscillator $VCO_2$ 32 is structurally similar to $VCO_1$ 18, which was described above.

Selection of a high or low half of the entire frequency range is made by a control signal on line 31 from the microprocessor 20. This signal short-circuits or open-circuits a PIN diode at an inductor of the $VCO_2$ 32. The control voltage for the variable capacitance of $VCO_2$ 32 is obtained by effectively adding the output voltage of loop filter 30 and the pretuning signal from control line 27, which comes from the D/A 23. The output from $VCO_2$ 32 is connected to the final output port 34 of the synthesizer, and to one input of the mixer 22.

FIG. 3 relates to the step frequency subsystem 1. The 11 solid vertical lines of that figure, having reference numerals 560, 640, etc. up to 1,360 represent the picket frequencies at the output of the comb frequency generator 8. The reference numerals that designate them are also their frequencies in MHz. Although all 11 (and more) of the pickets are present simultaneously, only one is utilized at any one time. In the example illustrated in FIG. 3, the reference frequency being used, $f_2$, is 800 MHz. An unselected reference frequency, namely 880 MHz, is also shown in order to illustrate the manner in which step frequencies such as frequency $f_3$ are made available at 40 MHz intervals at the output of $VCO_1$ 18, although the pickets of comb generator 8 are spaced at 80 MHz intervals.

When either 780 MHz or 820 MHz (or certain others) is the desired output frequency of $VCO_1$ 18, the 800 MHz picket is selected to be $f_2$. When 780 MHz is desired, it is produced by subtracting the 20 MHz of the reference generator 4 from the 800 MHz of the comb generator 8. When a frequency of 820 MHz is desired as the output frequency $f_3$ of $VCO_1$ 18, it is generated by adding the 20 MHz of reference generator 4 to the 800 MHz picket frequency $f_2$ of the comb generator 8, as shown in FIG. 3. In the example being described, in which $f_2$ is 800 MHz, let $f_3$ be 820 MHz.

Figure 4:
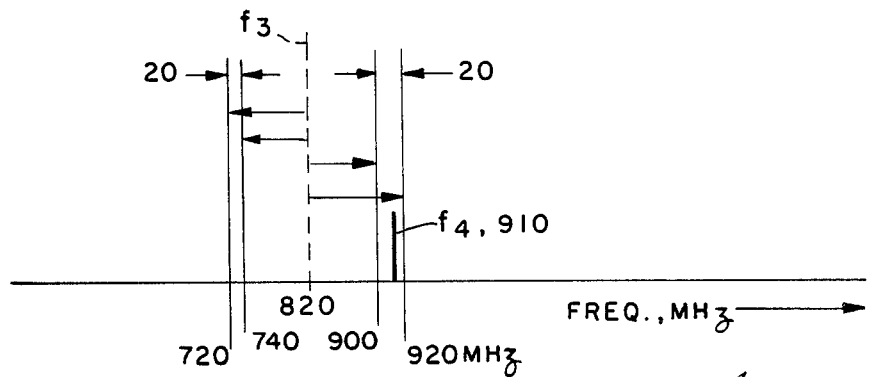
FIG. 4 is a stylized spectrum showing the two fine frequency adjustment ranges provided by translation oscillator subsystem 2 that are based on a typical one of the step frequencies.

FIG. 4 relates to the translation subsystem 2. It shows the step frequency $f_3$ of 820 MHz, which passes through port 19 to one input of mixer 22 in the translation subsystem 2. When the desired output frequency from the synthesizer is in a range that utilizes the step $f_3=820$ MHz, the frequency 820 MHz is selected by the microprocessor 20, by means of the control signals on control lines 25, 29 that enter $VCO_1$ 18. An example is the range 720 to 740 MHz, as illustrated by the boundaries bearing reference numerals 720, 740 in FIG. 4.

The step frequency 820 MHz serves for the generation of two frequency ranges of the translation oscillator, namely 720 to 740 MHz and 900 to 920 MHz. The range 720 to 740 MHz is generated by subtracting a fine frequency signal of 80 to 100 MHz from the step frequency 820 MHz. The range 900 to 920 MHz is produced by adding the fine frequency signal of 80 to 100 MHz, to the step frequency 820 MHz. To complete a specific example, when the desired output frequency $f_4$ is to be 910 MHz as shown in FIG. 4, it is obtained by setting the fine frequency $f_1$ at 90 MHz and adding the fine frequency signal to the step frequency 820 MHz.

In a similar manner all frequencies $f_4$ in the span from 640 MHz to 1,280 MHz are achievable by combinations of $f_1$, $f_2$ and $f_3$. This is illustrated by the Range Table of FIG. 5, in which each row is a frequency range.

Further specific examples of $f_4$ frequency generation by means of selection of the frequencies $f_1$, $f_2$ and $f_3$ are given in FIG. 6.

The described invention discloses the concept of cascading two or more subsystems each of which has above-and-below tuning capability, to provide a very wide output frequency span. With only 11 $f_2$ frequencies (560 to 1360 MHz), and a fine adjustment $f_1$ tuning range of only 20 MHz (80 MHz to 100 MHz), the product of the number of frequencies by the fine adjustment range is only $11 \times 20$ MHz $= 220$ MHz. However, in the described embodiment the span of output frequencies available is 640 MHz to 1,280 MHz, which is a span of 640 MHz. This 640 MHz span is almost three times as great as the 220 MHz span that would be available if the technique of tuning both above and below the frequencies $f_2$ were not employed. Moreover, if this "above-and-below" tuning technique were employed only in step subsystem 1, the greatest achievable span would be $2 \times 11 \times 20$ MHz=440 MHz.

By utilizing subsystems 1 and 2 in cascade, and even more such above-and-below subsystems, in a single frequency synthesizer, a total frequency span which is many times as great as the product of $f_2$ frequencies $\times$ fine adjustment range can be covered. In a device having three such subsystems in cascade, for example, a first stage having 11 frequencies $f_2$ could provide as many as $2 \times 11, = 22$ step frequencies. The preferred embodiment described herein is an example in which 20 step frequencies $f_3$ are provided.

A new (additional) intermediate stage, interposed at the point of reference numeral 19, FIG. 4, could again double or almost double the number of reference frequencies; its VCO would be tunable both above and below the output frequency of $VCO_1$ 18 by the amount of a low frequency crystal reference signal generator's frequency, and therefore have $2 \times 20 = 40$ frequencies at its VCO's output.

The last stage (fine adjust) could be the one described in the preferred embodiment. It could be supplied at its input with about 40 reference step frequencies. Its output could conceivably approach $2 \times 40 = 80$ ranges, because this last stage also has above-and-below tuning capability.

Such an additional subsystem would be of exactly the same configuration as subsystem 2, (FIG. 4), except that the source of $f_1$ would be replaced by a fixed frequency crystal oscillator similar to oscillator 4. The signal $f_3$ from subsystem 1 would connect to the additional subsystem as an input to a mixer like 22, and the output of the new subsystem's VCO would serve as an input to mixer 22 of subsystem 2.

It is instructive to compare the heterodyning concept, which is a part of the invention, with the divider concept of the prior art. In a prior art synthesizer of the type that uses a programmable divider between the VCO and the phase comparator, the signal and phase noise out of the VCO are translated down to a low frequency through the divider system. When expressed in terms of degrees of the frequency of the wave that carries it, the phase noise diminishes upon division, because the period of the wave that carries it increases. Thus the noise that originates in the VCO (and in other loop components between the output port of the 20 MHz phase comparator and the VCO) is understated after it has been divided.

In such prior art systems, this understatement of the noise at the phase comparator places a great demand upon the loop gain; to compensate for it, the loop gain would have to be very high. However, very high loop gain in such a prior art system would magnify the noise (as seen at the voltage-controlling DC input terminal of the VCO) that arises in the reference source, in the 20 MHz phase comparator, and in the loop filter.

In the invented system, the UHF signal from the comb generator is mixed with the VCO output and heterodyned down to a low (e.g., 20 MHz) frequency. Both the pure carrier signal and the noise that is superimposed upon are heterodyned down. The phase relationship between the phase noise and the carrier frequency that carries it is invariant during the down-conversion, because phase relationships are preserved through heterodyning by a local oscillator used in common.

The phase noise that is brought down to the mixer 10 from the VCO does not, therefore, suffer from the division that occurred in the prior art divider systems. The noise is therefore not understated as it was in the prior art, and the full undivided impact of the VCO's phase error is present at the phase comparator 14. After phase comparison, the full phase error of the VCO is therefore transmitted as negative feedback from the phase comparator 14 through the loop filter 16 to the frequency-controlling input terminal of the $VCO_1$ 18, where it corrects the noise.

It might be thought that the reduction of noise level accomplished by heterodyning instead of dividing would be offset by addition of noise introduced from the "local oscillator", i.e., the output of the comb generator. It is not offset. Phase noise originating in the reference oscillator would, in the absence of precautions, be magnified when the frequency is multiplied by the multiplier 6 and the comb generator 8, because the period of the wave carrying the noise is smaller at the higher frequencies. However, this undesirable magnification is easily overcome by narrowbanding the channel consisting of the multiplier 6 and the comb generator. It can be narrowbanded, because none of its frequencies (multiples of 20 MHz in this embodiment) need be switchable to any other value. The result is that a low-noise signal is available out of the comb generator.

Narrowbanding of the reference channel (having the multiplier 6 and comb generator 8) does not diminish the response time of the primary phase lock loop 10, 12, 14, 16, 18, because it is not in that primary loop. The prior art divider system cannot reduce noise by narrowing its bandwidth, because the divider itself is in the primary phase lock loop, and reduction of its bandwidth would increase the noise of the final output and reduce the switching speed.

Thus, the noise improvements of heterodyning are not offset by introduction of noise from the reference (multiplier) channel, because the reference channel can be made and is made very narrowband without impairing the synthesizer's switching speed or noise response time.

It will be understood that the description above of specific apparatus is intended only to serve as an example of the invention. The scope of the inventive concept is much broader, and is defined by the claims.

What is claimed is:

1. A frequency generator comprising:
reference frequency means for providing a reference signal of stable frequency and phase;
frequency multiplier means receiving said reference signal for providing a signal having a multiplied frequency that is at least four time said reference frequency;
voltage controlled oscillator means (VCO) for providing an AC signal whose frequency is of the same order of magnitude as said multiplied frequency and is controllable by a DC control voltage at a control terminal, said AC signal being perturbed by some phase noise that is manifested as phase angle excursions of said AC signal;
heterodyne means receiving (a) said VCO AC signal and said noise and (b) said multiplied frequency signal, for providing a down-converted signal and phase noise of undivided phase angle excursions, whose frequency is the difference of the frequencies of said VCO and multiplied signals;

phase comparator means receiving
(c) said reference signal and
(d) said down-converted signal and said phase noise of undivided phase angle excursions,
for providing a phase error signal indicative of the phase difference between said reference and down-converted signals; and, filter means receiving said phase error signal for providing said DC control voltage, with predetermined bandwidth and loop again, to said control terminal of said VCO;

whereby a phase lock loop is established in which the phase noise perturbing said VCO signal is effectively translated to the phase comparator means with undivided phase angle excursions, to enable corrective feedback of the phase lock loop to effectively reduce the noise.

2. A frequency generator as in claim 1 and wherein: said frequency multiplying means comprises means for multiplying the frequency of said reference signal by a multiplying factor N.

3. A frequency generator as in claim 1 and in which the phase lock loop's gain-bandwidth product divided by the frequency of said VCO is at least 0.001 (1/1000).

4. A frequency generator in claim 1 and wherein said frequency multiplier means comprises means having a plurality of multiplying factors for making available a plurality of multiplied frequencies, whereby the frequency generator has capability for generating a selectable one of a plurality of output frequencies.

5. A frequency generator as in claim 4 and further comprising pretuning means for pretuning said VCO to a selectable one of said plurality of output frequencies.

6. A frequency generator as in claim 5 and in which said multiplying means further comprises at least one balanced diode frequency doubler.

7. A frequency generator as in claim 5 and wherein said multiplying means comprises comb generator means utilizing a step recovery diode for producing a plurality of multiplied frequencies.

8. A frequency generator as in claim 6 and wherein said VCO is pretunable to selectively lock its frequency above a selected multiplied frequency or below the same multiplied frequency.

9. A frequency generator as in claim 6 and wherein said heterodyne means comprises;
mixer means receiving (a) said VCO AC signal and (b) said multiplied frequency signal, for outputting a difference frequency signal inter alia; and,
bandpass filter means receiving said difference frequency signal inter alia from said mixer for providing a filtered output containing only said down-converted signal.

10. A frequency synthesizer comprising:
reference frequency means for providing a reference signal of stable frequency and phase;
frequency multiplier means receiving said reference signal for providing at least one local signal having a multiplied frequency that is at least four times said reference frequency;
first voltage controlled oscillator means (VCO$_1$) for providing an AC signal whose frequency is of the same order of magnitude as said local multiplied frequency and is controllable by a first DC control voltage at a first control terminal;

first heterodyne means receiving (a) said VCO$_1$ AC signal and (b) said local multiplied frequency signal, for providing a first down-converted signal whose frequency is the difference of the frequencies of said VCO$_1$ signal and multiplied signal;

first phase comparator means receiving (c) said reference signal and (d) said first down-converted signal for providing a first phase error signal indicative of the phase difference between said reference and first down converted signals; and, first filter means receiving said phase error signal for providing said first DC control voltage, with predetermined bandwidth and loop gain, to said first control terminal of said VCO$_1$, whereby a first phase lock loop is established;

second voltage controlled oscillator means (VCO$_2$) for providing (e) an AC signal whose frequency is of the same order of magnitude as said VCO$_1$ AC signal's frequency and that is controllable by a second DC control voltage at a second control terminal;

second heterodyne means receiving (e) said VCO$_2$ AC signal and (a) said VCO$_1$ AC signal serving as a local signal, for providing (f) a second down-converted signal whose frequency is the difference of the frequencies of said VCO$_2$ and VCO$_1$ signals;

means for providing (g) a fine adjustment frequency signal;

second phase comparator means receiving (g) said fine adjustment frequency signal and (f) said second down-converted signal for providing a second phase error signal indicative of the phase difference between (g) said fine adjustment frequency signal and (f) said second down-converted signal; and, second filter means receiving said second phase error signal for providing said second DC control voltage, with predetermined bandwidth and loop gain, to said second control terminal of said VCO$_2$;

whereby a second phase lock loop is established whose (e) VCO$_2$ AC signal is available to serve as an output signal of the synthesizer.

11. A frequency synthesizer as in claim 11 and wherein:
said frequency multiplier means comprises means for multiplying the frequency of said reference signal by a plurality of different multiplying factors to make available a plurality of multiplied frequencies; and,
said first and second voltage controlled oscillator means VCO$_1$ and VCO$_2$ comprise pretuning means for locking on selectively so as to be based on a selectable one of a plurality of received local frequencies.

12. A frequency synthesizer as in claim 11 and wherein at least one of said voltage controlled oscillator means VCO$_1$ and VCO$_2$ comprises means for the pretuning of its frequency to selectively lock its oscillation frequency above or below one local frequency, whereby a plurality of two to four selectable VCO$_2$ output frequency ranges are based upon one said local frequency multiplier signal.

13. A frequency synthesizer as in claim 11 and wherein;
said frequency multiplier means comprises means for multiplying the frequency of said reference signal by a plurality of different multiplying factors to make available a plurality of multiplied frequencies;

said second voltage controlled oscillator means $VCO_2$ comprises pretuning means for locking on selectively so as to be based on one of a plurality of said output frequencies. whereby $VCO_2$ has capability for generating a selectable one of a plurality of frequencies; and, at least one of said $VCO_1$ and $VCO_2$ means comprises means for selectively locking its AC signal frequency above at least one of its respective said local signal frequencies or below the same respective said local signal frequency.

14. A frequency synthesizer as in claim 14 and wherein said $VCO_1$ and $VCO_2$ means comprise pretuning means for approximately pretuning the AC signal frequency for said selective locking.

15. A frequency synthesizer comprising a plurality of subsystems connected in cascade, each comprising a phase lock loop and a VCO, each receiving an input signal, each providing an "other" signal whose frequency is to be selectively added to or subtracted from the frequency of its respective input signal to produce an output signal from the subsystem, the output signal of each subsystem except the last being connected to be the input signal of the next succeeding subsystem, and wherein at least two of said VCOs are selectively tunable to frequencies above and below the frequencies of their respective received input signal by an amount equal to the frequency of said "other" signal.

* * * * *